United States Patent [19]
Barraclough et al.

[11] Patent Number: 5,077,143
[45] Date of Patent: Dec. 31, 1991

[54] SILICON ELECTROLUMINESCENT DEVICE

[75] Inventors: Keith G. Barraclough; David J. Robbins, both of Malvern; Leigh T. Canham, Malvern Wells, all of Great Britain

[73] Assignee: The Secretary of State for Defence in Her Britannic Majesty's Government of the United Kingtom of Great Britain and Northern Ireland, London, England

[21] Appl. No.: 435,392

[22] PCT Filed: Apr. 25, 1988

[86] PCT No.: PCT/GB88/00319
§ 371 Date: Nov. 6, 1989
§ 102(e) Date: Nov. 6, 1989

[87] PCT Pub. No.: WO88/09060
PCT Pub. Date: Nov. 17, 1988

[30] Foreign Application Priority Data

May 14, 1987 [GB] United Kingdom ............... 8711373

[51] Int. Cl.$^5$ .................... B32B 9/00; H05B 33/14; H05B 33/22
[52] U.S. Cl. .................... 428/690; 313/506; 357/61; 357/63; 357/17; 437/15; 437/20; 437/17; 437/173; 437/905; 428/917
[58] Field of Search ............ 428/690, 691, 917; 313/506, 507, 509; 357/17, 61, 63; 437/15, 17, 173, 20, 905

[56] References Cited
U.S. PATENT DOCUMENTS 4,071,945  2/1978  Karatsjuka et al. ............... 29/578
4,857,803  8/1989  Anderson, Sr. .................. 313/509

Primary Examiner—James J. Seidleck
Assistant Examiner—Charles R. Nold
Attorney, Agent, or Firm—Nixon & Vanderhye

[57] ABSTRACT

An electroluminescent silicon device comprises a light emitting diode (10). The diode (10) includes a p+ semiconductor contact (42) and a n− layer (32), forming a p-n junction (43) therebetween. The n− layer (32) is carbon-doped and irradiated with an electron beam having electrons with energies of between 150 and 400 keV to form G-centres. The diode (10) is electroluminescent when forward biassed, radiative recombination occuring at the G-centres. The invention reconciles the conflicting requirements of creating luminescent defect centres by irradiation while avoiding damage to electronic properties. The device may be an integrated light emitting diode (200) incorporated in a CMOS microcircuit. Photon output from the diode (200) may be relayed to other parts of a CMOS microcircuit by an integrated waveguide (224).

15 Claims, 12 Drawing Sheets

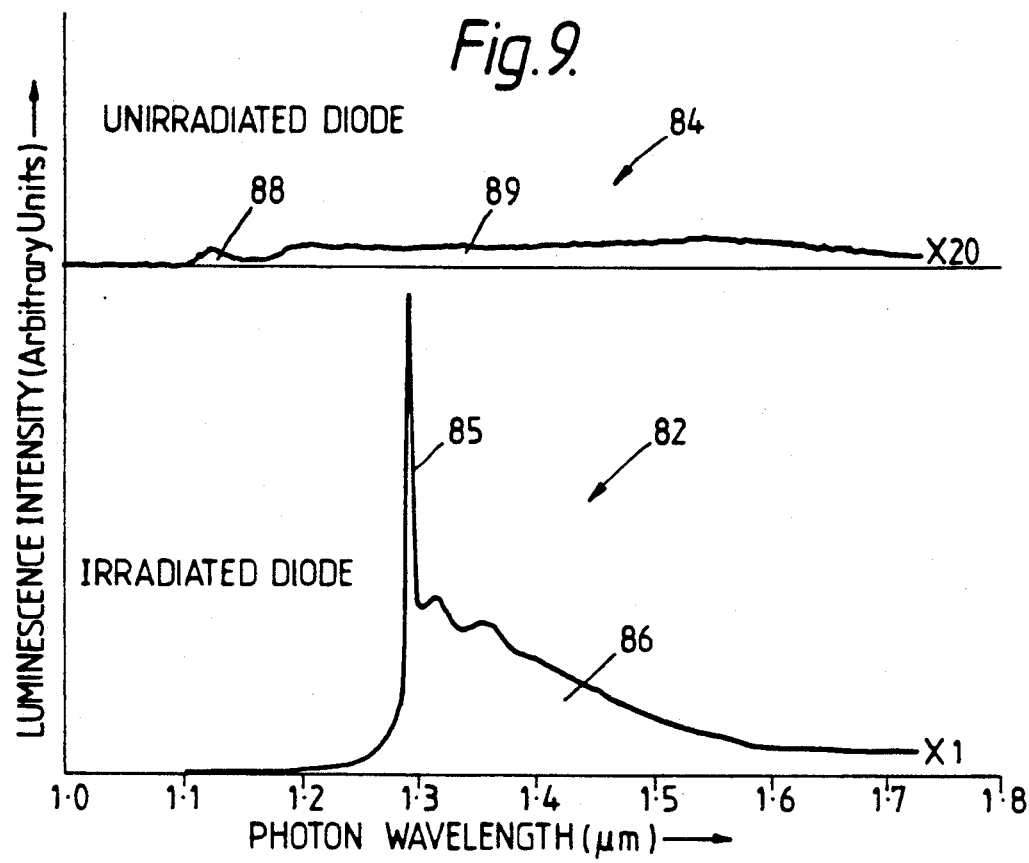
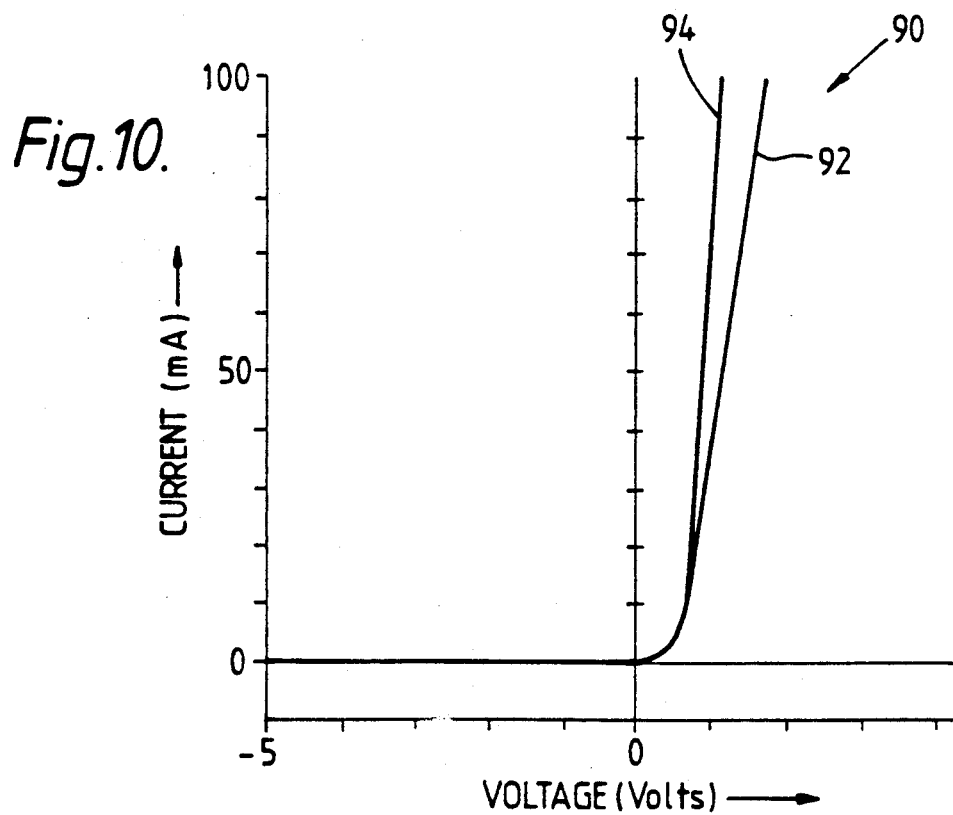

SILICON ELECTROLUMINESCENT DEVICE

BACKGROUND OF THE INVENTION

1. Field of the Invention

This invention relates to a silicon electroluminescent device.

2. Discussion of Prior Art

Silicon electroluminescent devices are required for the emerging field of integrated circuits incorporating integrated optical, electronic and electro-optical components. In IEEE Journal of Quantum Electronics, Vol QE-22, No 6, June 1986, Soref and Lorenzo describe silicon waveguides and electro-optical switches suitable for incorporation in conventional silicon integrated circuits. Silicon waveguides in particular are suitable for transmission of the fibre-optic communications wavelength interval 1.3–1.55 μm. The field of silicon integrated optics does however lack one important component; an electroluminescent light source in the 1.3–1.55 μm wavelength interval suitable for integration in silicon.

Electroluminescence relates to the production of light (luminescence) by a medium in response to passage of an electric current through the medium. A GaAs semiconductor light emitting diode (LED) is a common form of electroluminescent device. Such a diode has a pn junction which is forward biased in operation. Minority carriers are injected by the junction into regions of the diode where recombination takes place giving rise to luminescence. This process is not the only recombination route, and its efficiency may be expressed in terms of the number of photons produced per injected carrier (normally much less than unity). Moreover, photons may be reabsorbed in the device after they are produced. Accordingly, the process may be characterised by internal and external quantum efficiencies. Of these the former is the number of photons produced per injected carrier and the latter the number externally detected per injected carrier. The latter is necessarily of lower magnitude. It can be very much lower, since diode electrode and junction geometry requirements tend to conflict with those of photon output. In the related field of photoluminescence, in which a light beam is used to create free carriers for recombination, similar quantum efficiencies are defined. However, their values tend to differ less because no junction or electrode structure is required.

Group III–V LEDs such GaAs or InGaAsP devices are highly efficient and well developed; they exhibit internal quantum efficiencies of between 0.2 and 0.05. However, not being silicon-based, they cannot be easily integrated in silicon.

Silicon-based electroluminescent devices have been described in the prior art which produce luminescence from the following processes:

(1) band to band transitions,
(2) transitions arising from rare earth metal dopants in silicon, and
(3) recombination associated with irradiation-induced defect centres in silicon.

Electroluminescence arising from band to band transitions in pn junction silicon diodes is described by Haynes et al, Phys Rev 101, pp 1676–8 (1956), and by Michaels et al, Phys Stat Sol 36, p311 (1969). However, the internal quantum efficiency is in the region of $10^{-5}$, four orders of magnitude lower than conventional LEDs. It is a consequence of the indirect nature of the bandgap in silicon, which is a fundamental problem.

A silicon LED incorporating a rare earth dopant is disclosed by Ennen et al, Appl Phys Lett 46(4), 15 Feb. 1985, pp 381–3. This device consisted of epitaxially grown n and p type silicon layers doped with erbium. The Er dopant was introduced by implantation providing an ion concentration of $5.6 \times 10^{18}$ cm$^{-3}$. The diode exhibited an external quantum efficiency of $5 \times 10^{-4}$, which the authors observed was not of the order acceptable for device applications. It is about two orders of magnitude below that of conventional LEDs. Furthermore, rare earth ion implantation is disadvantageous for integrated circuit applications, since it is not electrically inactive; i.e. it introduces unwanted energy levels into the semiconductor forbidden gap. These levels tend to disrupt the electrical properties of the host silicon. In this connection, the Ennen et al device exhibits poor rectifying characteristics. Carrier injection, quantum efficiency and luminescence are therefore poor. Rare earth dopants are also unlikely to be compatible with integrated circuit technology, since their use to make integrated LEDs may disrupt neighbouring electronic devices on the same silicon chip.

Silicon electroluminescent diodes incorporating irradiation generated defect centres are disclosed by Ivanov et al, Sov Phys Sol State Vol 6, No 12, pp 2965–6, June 1965, and also by Yukhnevich, Sov Phys Sol State Vol 7, No 1, pp 259–260, July 1965. In both cases, luminescent defect centres were produced by irradiation from a cobalt-60 source with the γ-ray energies in excess of 1 MeV. Quantum efficiencies are not quoted by these authors, but it is well known that irradiation at such high energy severely degrades diode electrical properties. See for example "Radiation Effects in Semiconductors and Semiconductor Apparatus", published by the Consultants Bureau, New York. A diode without significant radiation damage exhibits sharply increasing bias current as a function of forward bias voltage until a saturation current is reached. Radiation damage reduces both the rate of increase of forward bias current and the saturation current. This reduction or degradation worsens with increasing irradiating beam energy and dose. It is associated with worsening carrier transport properties of the diode junction, with consequent reduction in internal quantum efficiency. This indicates that irradiation dosage and beam energy should be minimised in this form of diode, in order to minimise damage and preserve the carrier injection properties of the recifying junction. However, to increase luminescence output, it is necessary to increase radiation damage. This has been demonstrated in the related field of photoluminescence by Davies et al, Sol State Commun Vol 50, p 1057 (1984). The requirement for high luminescent output consequently conflicts with that for efficient minority carrier injection, and the conflict is not reconciled in the prior art.

SUMMARY OF THE INVENTION

It is an object of this invention to provide an electroluminescent device of silicon material.

The present invention provides an electroluminescent device including a luminescent region of silicon material and rectifying means for injecting minority carriers into the luminescent region, and wherein the luminescent region contains:

(i) at least $10^{16}$ carbon atoms cm$^{-3}$ in solid solution arranged to trap silicon interstitials and provide an irradiation generated luminescent defect centre concentration of at least $10^{14}$ cm$^{-3}$, (ii) a divacancy concentration less than $10^{15}$ cm$^{-3}$, and (iii) an electrically inactive dopant having vacancy trapping properties and a concentration of at least $10^{16}$ cm$^{-3}$.

The invention provides an electroluminescent silicon device based on irradiation activated defect centres in which the conflicting demands of minority carrier injection and luminescence output are reconciled. In one embodiment, the invention has been shown to produce a one thousandfold improvement in luminescence output intensity as compared to band to band recombination radiation from a similar device. The above limits to the carbon, divacancy and electrically inactive dopant concentrations are the extreme limits; in a preferred embodiment the carbon, defect centre and electrically inactive dopant concentrations are at least $10^{18}$ cm$^{-3}$, $10^{16}$ cm$^{-3}$ and $10^{18}$ cm$^{-3}$ respectively. Of these the first is above the maximum solubility limit of carbon in silicon.

The irradiation activated defect centres are preferably G centres, i.e. $C_S$—$Si_I$—$C_S$ complexes which emit radiation in the 1.3-1.6 μm band ($C_S$=substitutional carbon, $Si_I$=silicon interstitial). P or H centres may alternatively be employed. The electrically inactive dopant may be oxygen, but preferably it is an element which is isovalent with silicon, i.e. Ge, Sn or Pb.

In a preferred embodiment, the rectifying means is a pn junction between the luminescent region and a second region of opposite conductivity type. Alternatively, the rectifying properties of the diode may be obtained by constructing it in Schottky barrier or tunnel diode form.

In an alternative aspect, the invention provides a method of manufacture of an electroluminescent device, the method including the steps of:

(i) forming a diode including a carbon-doped silicon electroluminescent region containing vacancy trapping means, and (ii) irradiating the luminescent region with an electron beam having energy sufficient to produce vacancies but insufficient for direct creation of divacancies.

Despite the teachings of the prior art that irradiation to produce luminescent defect centres degrades diode properties unacceptably, it has surprisingly proved possible to manufacture a diode which combines acceptable luminescence and carrier injection characteristics. This has been achieved by irradiating at moderate energies to create luminescent defect centres incorporating silicon interstitials without generating significant numbers of divacancies which degrade electrical properties. Furthermore, the use of vacancy trapping means inhibits formation of divacancies arising from mobile single vacancies combining together.

The method of the invention preferably involves formation of the diode luminescent region with a carbon dopant concentration of at least $10^{18}$ cm$^{-3}$, this being above the maximum solubility limit for carbon in silicon. Vacancy trapping is preferably provided by doping the luminescent region with Ge, Sn or Pb, although an oxygen dopant may also be employed. The electron beam energy and dosage may be in the ranges 150 keV to 400 keV and $10^{15}$ to $10^{19}$ electron/cm$^{-2}$ respectively, where higher beam energy corresponds to lower dosage. Preferably however these ranges are 290 keV to 310 keV and $10^{16}$–$10^{18}$ electrons/cm$^{-2}$.

The invention also provides an electroluminescent device made by the foregoing method.

BRIEF DESCRIPTION OF THE DRAWINGS

In order that the invention might be more fully understood, embodiments thereof will now be described by way of example only, with reference to the accompanying drawings wherein common parts are like-referenced, and in which:

FIG. 9 shows two 77 K. electroluminescence spectra, one from the FIG. 1 diode, and the other from an unirradiated diode manufactured in accordance with FIGS. 2 to 4 and 6 (i.e. and irradiated and unirradiated diode respectively);

FIG. 10 shows two superimposed I–V curves at 293 K. for the diodes used to produce the spectra of FIG. 9;

DETAILED DISCUSSION OF PREFERRED EMBODIMENTS

Figure 1:
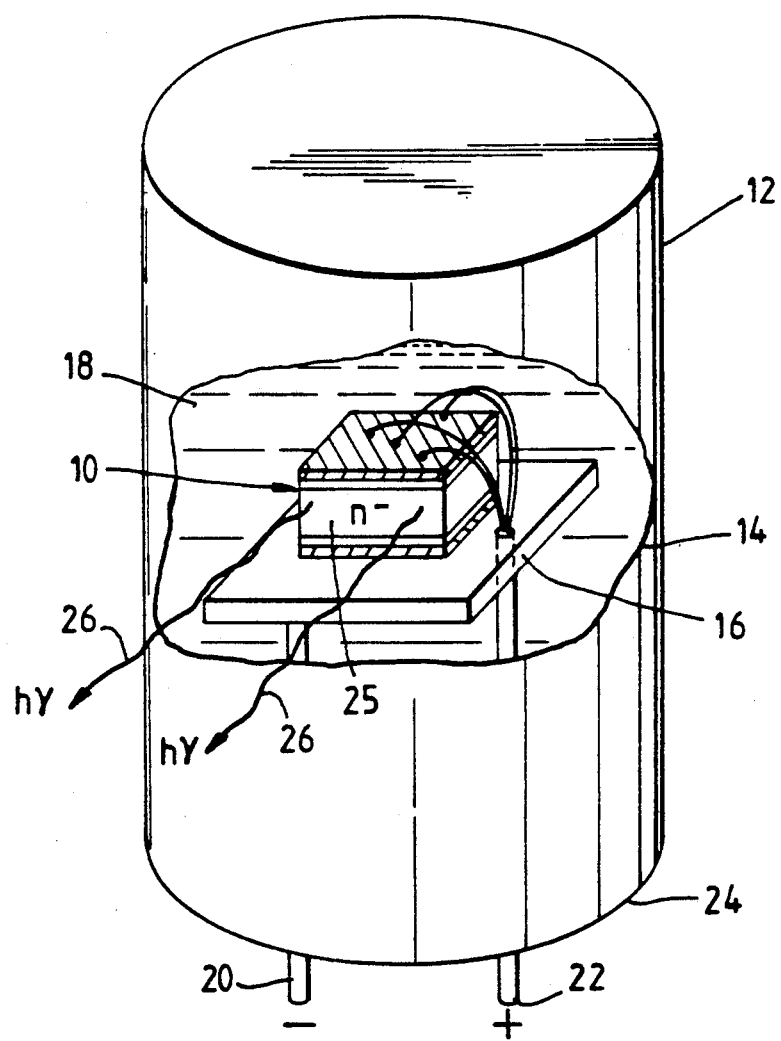
FIG. 1 shows an edge-emitting light emitting diode of the invention in a cryostat with a part removed to facilitate viewing of interior detail.
Figure 2:
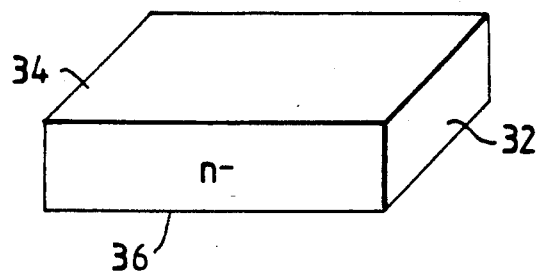
FIGS. 2 to 6 illustrate steps in the manufacture of the FIG. 1 diode.

Referring to FIG. 1, there is shown a light emitting diode 10 of the invention. The diode 10 is incorporated in a cryostate 12 shown partly cut-away at 14. Diode 10 is mounted on a metallic header 16, and immersed in liquid nitrogen 18 at a temperature of 77 K. Connection leads 20 and 22 to the diode 10 are fed through a base 24 of the housing 12, for external bias voltage supply. Lead 20 is connected to header 16 which in turn is connected to the lower face of diode 10. Lead 22 is insulated from header 16 and is connected to the top face of diode 10.

In operation, infrared photons as indicated by arrows 26 are emitted from an edge 25 of the diode 10 when a voltage is applied across the leads 20 and 22 such that diode 10 is forward biased. The expression "edge" is conventional terminology in the art of light emitting diodes. It relates to light emission in the plane of an electroluminescent layer as opposed to perpendicular to it. As illustrated however, "edge" 25 relates to part of a diode face. The cryostat 12 has an infrared radiation transparent window (not shown) opposite edge 25 for transmission of photons.

FIGS. 2 to 6 illustrate successive steps in the fabrication of the diode 10. A highly carbon doped silicon wafer 32 is prepared from a dislocation-free silicon crystal with a substitutional carbon atom concentration of $2 \times 10^{18}$ atom cm$^{-3}$, an interstitial oxygen concentration of $1 \times 10^{18}$ atom cm$^{-3}$, and a phosphorus dopant concentration of $5 \times 10^{15}$ atom cm$^{-3}$. The wafer 32 is 200 $\mu$m in thickness.

The concentration of substitutional carbon in the silicon wafer 32 is nearly an order of magnitude above the normally accepted value for the maximum equilibrium solubility limit for carbon in pure silicon ($3 \times 10^{17}$ cm$^{-3}$). This is achieved by pulling the silicon crystal vertically from a carbon doped melt within a vertical magnetic field of between 1000 and 2000 gauss in strength. Under these conditions it is possible to increase the oxygen content of the melt and also to reduce carbon evaporation. High interstitial oxygen content stabilises the high levels of carbon in silicon substitutional sites, as will be described later.

Figure 3:
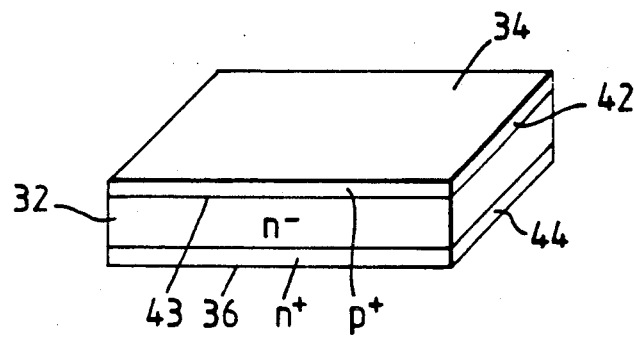

The upper surface 34 of the wafer 32 is polished and the lower surface 36 is lapped. The upper wafer surface 34 is boron implanted with an ion dose of $5 \times 10^{15}$ atoms cm$^{-2}$ using ion energies of 50 keV. A similar phosphorus implant on the lower surface 36 is carried out with an ion dose of $5 \times 10^{15}$ atoms cm$^{-2}$ and ion energies of 100 keV. Activation of the boron and phosphorus implants and removal of lattice damage are carried out by rapid thermal annealing at 1200° C. for 10 seconds in argon. As shown in FIG. 3, this provides a heavily doped p-type or p+ layer 42. Consequently, a p+/n− junction 43 is formed below the surface 34 at a depth of approximately 0.4 $\mu$m. Immediately above the surface 36, a heavily doped n-type or n+ contact 44 is formed by the phosphorus implant.

Figure 4:
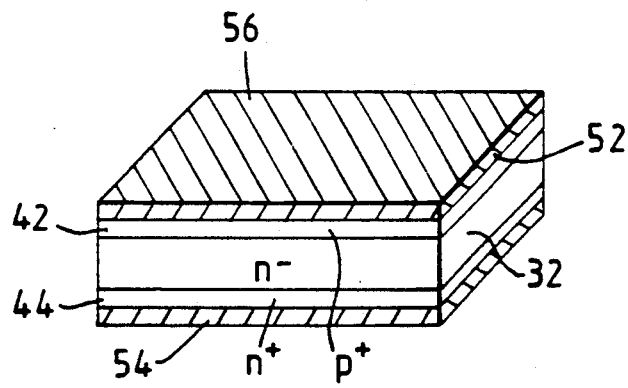
Figure 5:
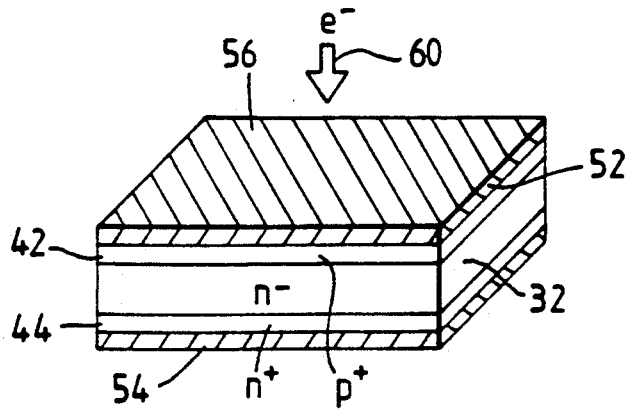
Figure 6:
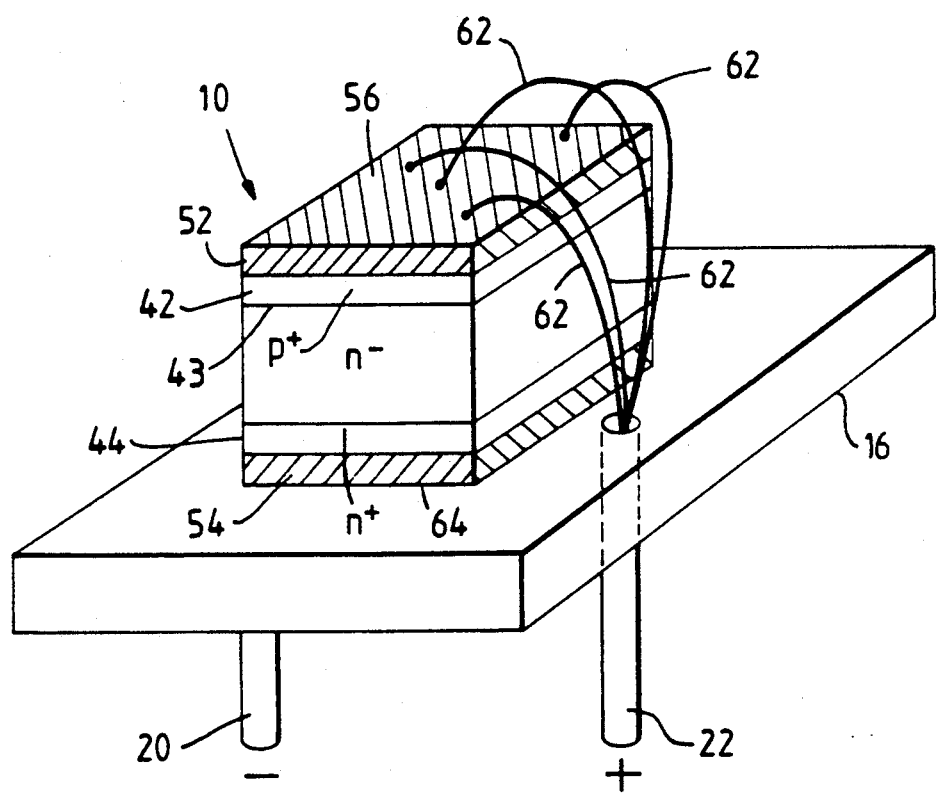

As shown in FIG. 4, the layers 42 and 44 receive metallisation layers 52 and 54, these comprising evaporated aluminium 1 $\mu$m in thickness. The metallisation is fired at 450° C. for 10 minutes in sintering gas to provide good ohmic contacts to the layers 42 and 44.

The wafer 32 is irradiated with an electron beam as indicated by an arrow 60, through the top surface 56 of the layer 52. The electron beam 60 has an energy of 300 keV and a current density of 5 $\mu$Amp cm$^{-2}$, and produces an incident flux of $3.5 \times 10^{16}$ electrons cm$^{-2}$ on surface 56. The irradiation is performed at room temperature with the wafer 32 supported on a heat sink.

The silicon wafer 32, and the aluminium layers 52 and 54, are scribed and cleaved into areas of 1 mm$^2$ to form $2 \times 0.5$ mm rectangular diodes such as the diode 10. A lower surface 64 of the aluminium layer 54 is bonded to the metallic header 16 with low temperature Epo-tek (Registered Trademark) H20E conducting epoxy resin by curing at 80° C. for 90 minutes. This provides electrical connection of diode 10 to header 16. Four gold wires 62 each of 25 $\mu$m thickness are thermocompression-bonded for electrical connection to various points spread over the surface 56. This multiple connection to the surface 56 distributes the input current and prevents the bonds from heating and becoming disconnected. The gold wires 62 are soldered to a terminus 66 of the lead 22, which passes through and is insulated from the header 16. In addition, lead 20 is connected to the header 16.

Figure 7:
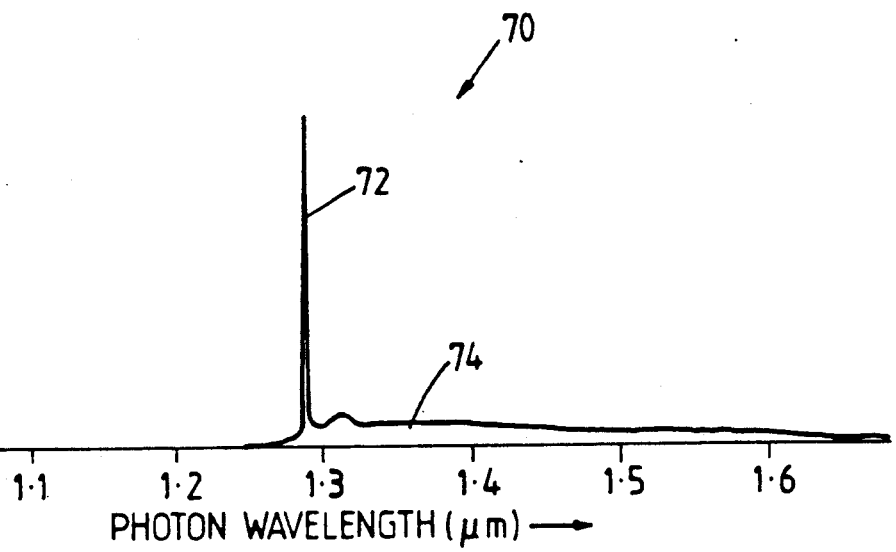
FIG. 7 shows a 4.2 K. photoluminescence spectrum from a diode structure of FIG. 3 which has been electron irradiated without the aluminium deposition step of FIG. 4.
Figure 8:
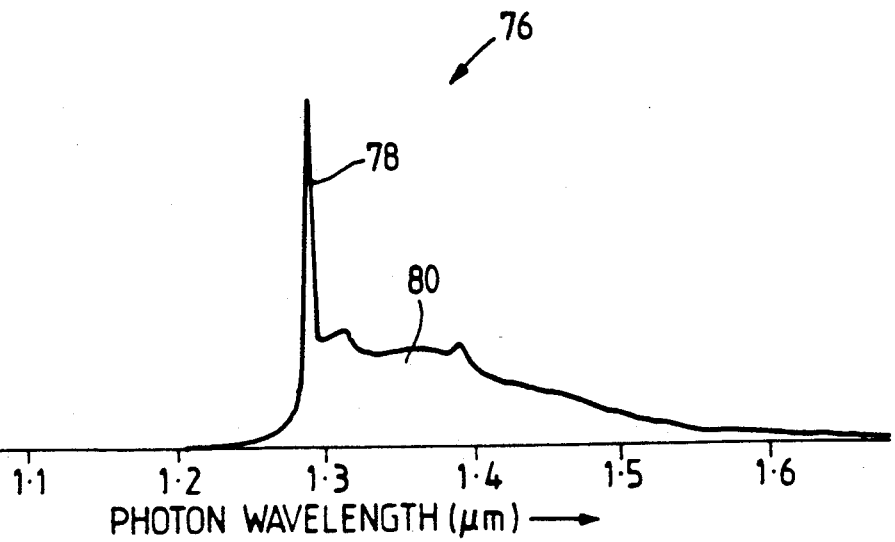
FIG. 8 shows a 77 K. photoluminescence spectrum from the diode structure used to obtain the FIG. 7 spectrum.

Referring to FIGS. 7 and 8, there are shown photoluminescence spectra 70 and 76 measured at respective temperatures 4.2 K. and 77 K. for diode structures formed as described above but without the aluminium layers. The 4.2 K. photoluminescence spectrum 70 was obtained with 0.5 mW of argon ion laser radiation at a wavelength of 5145 Å. The 77 K. photoluminescence spectrum 76 was obtained at the same excitation wavelength but a higher power of 100 mW. The photoluminescence spectrum 70 of FIG. 7 shows a zero phonon line 72 with a wavelength of 1.28 $\mu$m and a vibronic sideband 74 between approximately 1.3 and 1.6 $\mu$m. Both the zero phonon line 72 and the vibronic sideband 74 arise from a single type of defect known as a G-centre. The zero phonon line arising from G-centres is known as the G-line. The photoluminescence spectrum 76 of FIG. 8 also shows a G-line 78 and its vibronic sideband 80. In both FIGS. 7 and 8 photon output arises from optical excitation of G-centres created in the diode by electron beam irradiation.

The luminescence intensity of the G-line 78 is lower than the luminescence intensity of the G-line 72. The relative intensity of the vibronic sideband 80 compared with its G-line 78 is greater than the relative intensity of the vibronic sideband 74 compared with its G-line 72. However, above 77 K. the total luminescence intensity of the vibronic band decreases with temperature.

The vibronic sidebands 74 and 80 extend throughout the 1.3–1.6 $\mu$m wavelength range, the spectral range of interest for optical communication. As will be illustrated by subsequent data, G-centres show sufficient luminescence for VLSI interconnection purposes whilst not greatly affecting the electrical properties of the host silicon.

The photoluminescence spectra of the diode structures previously described are generated by photons with an energy above the band gap, which inject minority carriers into the silicon. Injection may alternatively be obtained by forward biasing the diode junction, which produces an electroluminescence spectrum as previously mentioned. This displays features similar to the photoluminescence spectrum of the diode, but is more sensitive to irradiation.

Referring now to FIG. 9 there are shown two electroluminescence spectra 82 and 84 measured at a temperature of 77 K. The spectra 82 and 84 were obtained respectively from the diode 10 and from an otherwise equivalent diode manufactured without the FIG. 5 electron irradiation step. Spectrum 84 is plotted with a vertical scale 20 times larger than that of spectrum 82. Both spectra correspond to diodes operated under forward bias with a junction current density of 10 A cm$^{-2}$. Photon output from diode 10 (spectrum 82) is due to luminescence from the G-centres on the n− side of the p+/n− junction 43. The electroluminescence spectrum 82 shows a G-line 85 and a vibronic sideband 86, and the spectrum 84 shows contributions 88 and 89 due to band-to-band recombination and other processes respectively. A comparison of the two spectra 82 and 84 shows that the integrated intensity of the G centre electroluminescence 85 and 86 is approximately 1000 times greater than the integrated intensity of the band-to-band electroluminescence 88 from the unirradiated diode. The external quantum efficiency of the irradiated diode 10 is therefore 3 orders of magnitude higher than that of band-to-band transitions in an unirradiated but otherwise equivalent diode. In the prior art of Ivanov et al, equal efficiencies were obtained for luminescence from defect centres and band-to-band transitions.

Irradiated diodes suffers damage to their electrical properties. A measure of this damage may be obtained from the current-voltage characteristic curves for the diodes before and after irradiation as described by Vavilov et al in Radiation Effects on Semiconductors and Semiconductor Apparatus previously mentioned. At a chosen forward bias current, the bias voltages before and after irradiation are obtained from the respective current-voltage characteristic curves of a particular diode. A ratio of these voltages indicates the degree of radiation damage, and this ratio is defined as a radiation damage coefficient for the purposes of this specification. A value of 2 for this coefficient signifies a typical limit above which the diode performance becomes seriously impaired by irradiation. Referring now to FIG. 10, there is shown an I-V characteristic 90, having curves 92 and 94, obtained from irradiated diode 10, and the unirradiated equivalent diode, respectively. The radiation damage coefficient for diode 10 obtained from curves 92 and 94 is approximately 1.3. Accordingly, the rectifying properties of the diode 10 were not seriously impaired by the comparatively modest irradiation treatment it underwent. It therefore combines good luminescence and carrier injection properties, unlike the prior art.

The invention provides luminescence arising from G-centres formed within the diode 10 by irradiation. Each G centre is a complex of two substitutional carbon atoms and an interstitial silicon atom. Before the G-centres can be formed by irradiation, the silicon should ideally be uniformly doped with carbon on lattice sites. In practice, it is sufficient that the carbon be in solid solution within the silicon, wherein a substantial proportion of the carbon is located on lattice sites. This may be achieved by incorporating the carbon doping at the silicon growth stage as previously described, or by ion implantation as will be described later.

Figure 11:
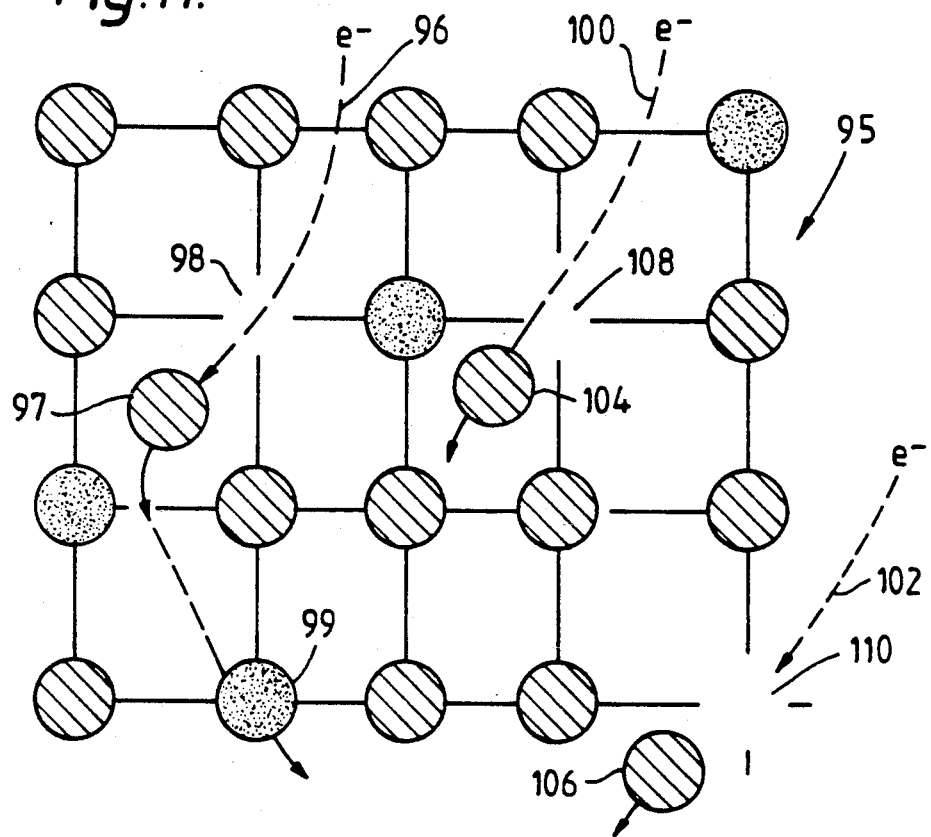
FIGS. 11 to 13 illustrate the radiation damage processes which occur within irradiated carbon doped silicon.
Figure 12:
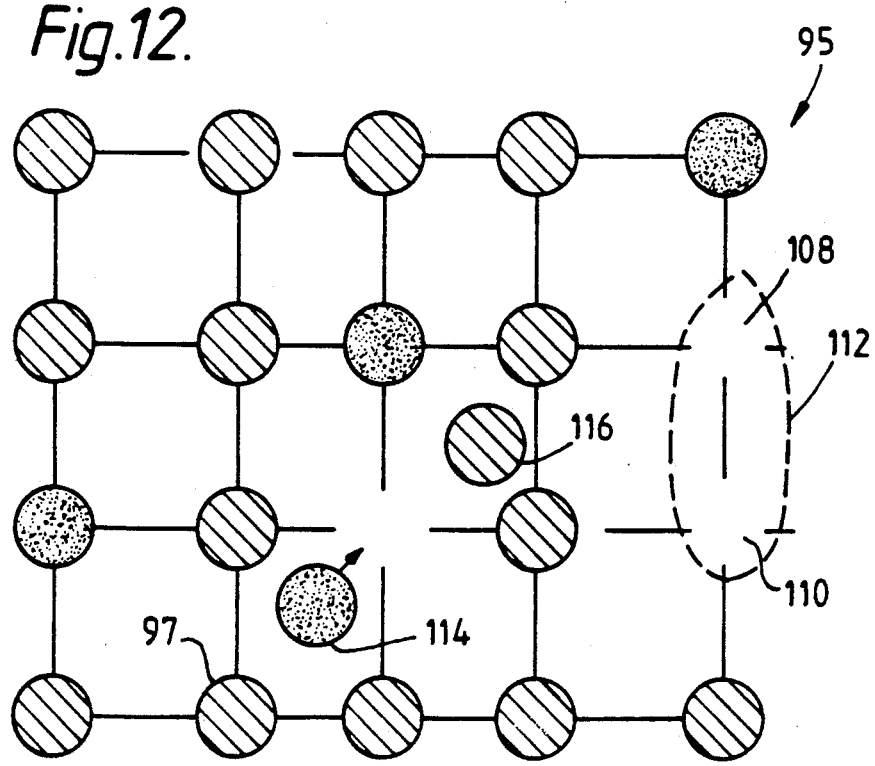
Figure 13:
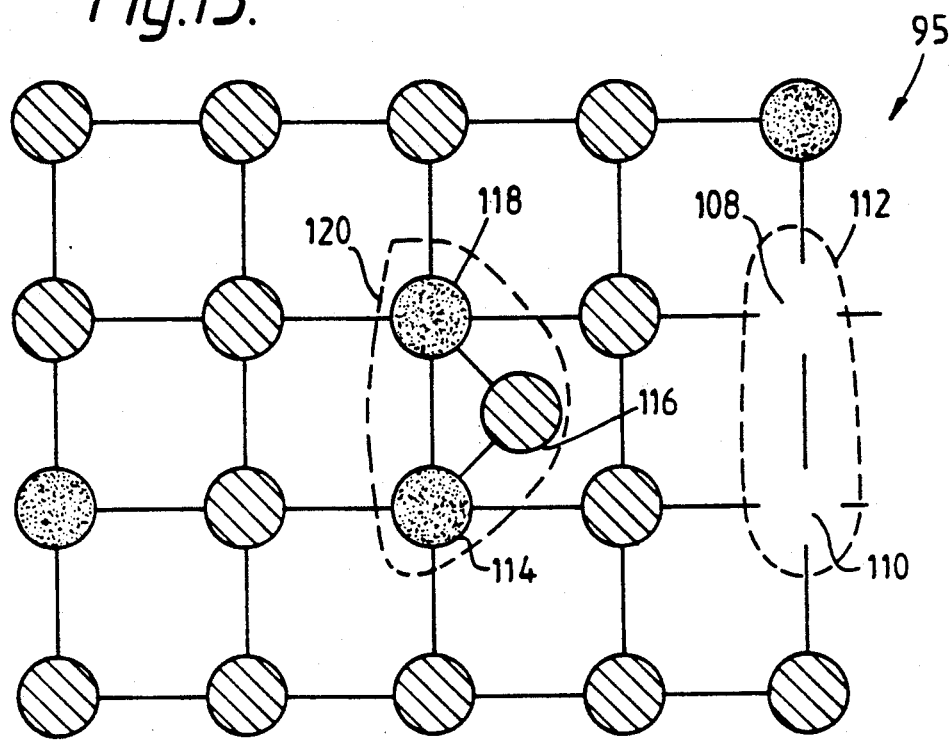

Referring to FIGS. 11 to 13, there are shown schematically examples of the internal processes occurring within a silicon lattice 95 under electron irradiation. The lattice 95 comprises silicon atoms, indicated by cross-hatched circles, and carbon atoms, indicated by solid circles. The carbon concentration depicted by FIGS. 11 to 13 does not have any relation to the actual carbon concentration of diode 10. In addition, the carbon atoms in FIGS. 11 to 13 are closer than in a silicon sample and carbon doped as described earlier. On irradiation, as shown in FIG. 11, an electron 96 displaces a silicon atom 97, creating a vacancy 98. The displaced silicon atom 97 then proceeds to displace a carbon atom 99. Two further electrons 100 and 102 displace respective silicon atoms 104 and 106, forming respective vacancies 108 and 110. These vacancies may migrate through the lattice 95 by movement of silicon and carbon atoms. In FIG. 12, they are shown having migrated to neighbouring lattice sites to form a divacancy 112. This drawing also shows a carbon atom 114, freed by collision with an electron displaced silicon atom, having displaced a silicon atom 116 and about to occupy its vacated lattice site; i.e. the silicon atom 116 becomes substituted by the carbon atom 114. FIG. 13 shows the silicon atom 116 having become trapped on an interstitial site. It is bound to the substitutional carbon atoms 114 and 118 to form a G-centre 120.

Figure 14:
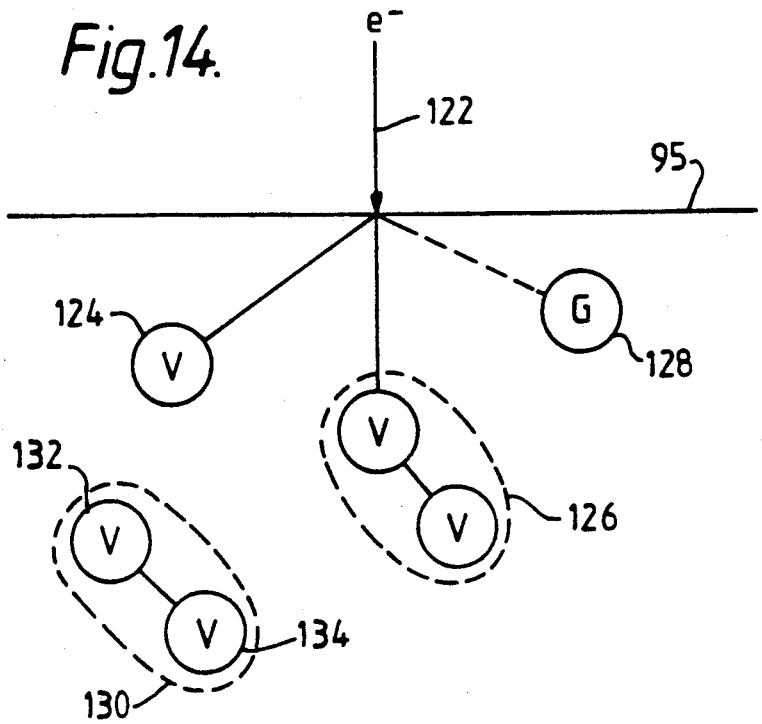
FIG. 14 shows a summary of the FIGS. 11 to 13 processes.

Referring now to FIG. 14, there is shown a schematic summary of the processes occurring within the lattice 95 upon irradiation. An electron 122 may directly create a vacancy 124 or if its energy is above the threshold for divacancy formation, a divacancy 126. The electron 122 may also indirectly create a G-centre 128. A divacancy 130 may also be formed by two vacancies 132 and 134 which migrate together. In the absence of other processes, the vacancy 124 may anneal out at room temperature or contribute to a divacancy. Divacancies and G-centres do not anneal out at room temperature. Furthermore, it is not possible to anneal out the divacancies without also annealing out G-centres.

As previously mentioned, irradiation of a diode impairs its rectifying properties, which limits its possible electroluminescence. This damage is caused by the divacancies created by irradiation. As the energy of irradiation rise, defects may be created comprising three or more vacancies. However, in general the concentration of these is small compared with the divacancy concentration, and may be ignored. Vacancies may also cause damage to diode rectifying properties, but these may be removed by vacancy traps as described later.

In this invention, it has been found that by restricting the concentration of divacancies to below $10^{15}$ cm$^{-3}$ the damage to the rectifying properties of an electroluminescent diode can be kept to an acceptable level. In one embodiment of diode 10, the concentration of divacancies was measured to be $2 \times 10^{13}$ cm$^{-3}$.

Referring once more to FIG. 14 there are at least two conditions which must be fulfilled to restrict the concentration of divacancies. These are:
(a) irradiating with an electron energy below the divacancy threshold energy;
(b) preventing the combination of vacancies to form divacancies.

In the prior art, the divacancy threshold energy was not known. It was estimated for the purposes of the present invention as will be described later. It was found that using irradiation energies of between 150 keV and 400 keV, unacceptable concentrations of divacancies could be avoided.

Prevention of divacancy formation by vacancy migration is achieved in this invention by doping the luminescent region of diode 10 with oxygen. Apart from stabilising the carbon content by relieving lattice strain, oxygen provides a trap for vacancies. By arranging for the oxygen concentration to be above $10^{16}$ cm$^{-3}$ (comparable with the carbon concentration), vacancies formed by irradiation are largely trapped before they may combine. In this way divacancy formation by indirect processes is reduced to acceptable levels. Interstitial oxygen is largely electrically inactive dopant in that it does not introduce unwanted energy levels into the semiconductor to any substantial extent. In fact, interstitial oxygen has an electrical activity typically $10^{-2} - 10^{-6}$ times that of a donor impurity, such as phosphorus. Isovalent dopants such as Ge, Sn or Pb also provide vacancy traps with even lower electrical activity.

As well as increasing damage to the diode's electrical properties, an increase in the energy of electron irradiation dose increases the concentration of G-centres and hence also the internal quantum efficiency. The increase in damage and G-centre concentration are competing factors, and no compromise between the two to provide an efficient electroluminescent device has been achieved in the prior art. In the following experiment, G-centre creation and concentration as a function of electron irradiation energy are investigated by photoluminescence. From the experimental results the damage to the rectifying properties of an irradiated diode may be ascertained, as well as the vacancy and divacancy creation threshold energies.

G-centre formation and corresponding luminescence emission were determined using Czochralski-grown silicon samples. The carbon and oxygen concentration differed between different samples by no more than 5%. The concentrations were $6.1 \times 10^{17}$ cm$^{-3}$ and $1.0 \times 10^{17}$ cm$^{-3}$ respectively. Each silicon sample was electron beam irradiated with a respective electron beam energy over the range 120–400 keV, but the total energy deposited per unit area was kept constant at $1.0 \times 10^{19}$ keV cm$^{-2}$. A respective photoluminescence spectrum was obtained for each silicon sample.

Figure 15:
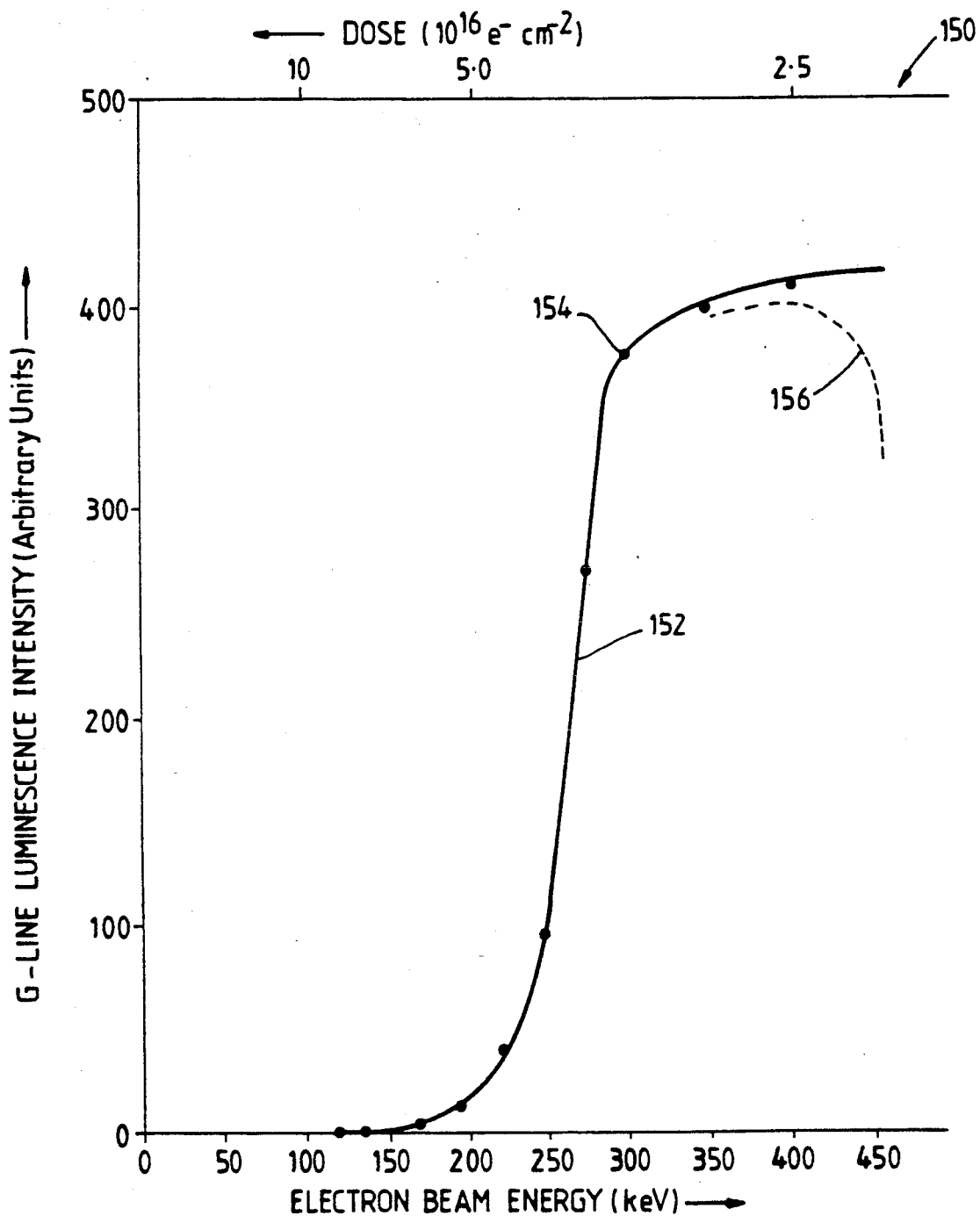
FIG. 15 shows a graph of G-line photoluminescence intensity experimentally obtained from a series of samples, and a theoretical electroluminescent intensity as a function of energy of the irradiating electron beam used in sample manufacture.

Referring to FIG. 15, there is shown a graph 150 of resulting G-line photoluminescence intensity per unit irradiated area (arbitrary units) against electron beam energy (keV) and beam dose ($10^{16}$ e$^-$ cm$^{-2}$), using data obtained by experiment. A curve 152 illustrates the intensity of G-line luminescence emanating from a unit irradiated area as a function of electron beam energy. Curve 152 exhibits a threshold value for G-centre creation of 150 keV. It is considered that this value corresponds to a threshold value for silicon interstitial creation by collisional displacement.

Above 150 keV on graph 150, the curve 152 rises rapidly. This demonstrates that between 150 keV and 300 keV, the creation of G-centres is stronly energy dependent; it varies by an order of magnitude between 225 keV and 300 keV. The curve 152 has a knee 154 above which it can be seen that little increase is gained in G-line intensity for further increase in the electron beam energy. Below the knee 154, G-line intensity drops rapidly.

As previously mentioned, the internal quantum efficiency of photoluminescence from irradiated silicon is not as dependent on irradiation damage as that of electroluminescence. As a result, photoluminescent efficiency is not as sensitive to irradiating beam energy as electroluminescent efficiency. The knee 154 on graph 152 indicates that photoluminescence is beginning to be affected by divacancy formation. Although G-centre concentration increases above the knee 154, the formation of divacancies also provides non-radiative recombination centres which reduce the number of carriers available for radiative recombination at G-centres. Divacancies also impair the rectifying properties of diodes formed by irradiation at energies above the knee 154. Consequently, beam energy affects electroluminescence more seriously than photoluminescence. A theoretical curve 156 shows the expected beam energy dependence of electroluminescent output from diodes incorporating respective silicon samples. Electroluminescence decreases beyond the knee 154, indicating that the increase in G-centre creation has become outweighed by availability of competing non-radiative processes.

Another experiment was used to determine the point at which electroluminescence is significantly affected. In this experiment, further 200 μm thick silicon samples containing $2 \times 10^{18}$ cm$^{-3}$ carbon atoms were irradiated at electron energies between 200 and 400 keV at a constant energy-dose product of $1.0 \times 10^{19}$ keV cm$^{-2}$. Resistivity was measured for each sample before and after irradiation. In a sample irradiated at 400 keV a change in resistivity of 14% was observed. Resistivity changes in samples irradiated at lower energies were insignificant. The divacancy concentration of the 400 keV irradiated sample was measured to be $5 \times 10^{15}$ cm$^{-3}$. This corresponds to a significant reduction in electroluminescent internal quantum efficiency. However, by maintaining the electron dose below $10^{16}$ electrons cm$^{-2}$ the divacancy concentration can be maintained below $10^{15}$ cm$^{-3}$ at 400 keV.

The previous experiments indicate that the vacancy creation threshold is approximately 150 keV, and the divacancy creation threshold is above about 300 keV, and an unacceptable divacancy concentration is obtained above 400 keV. Electroluminescent devices are manufactured in accordance with the invention with irradiation energies above the vacancy creation threshold and below beam energy producing unacceptable divacancy concentrations. The range of acceptable irradiation energies is 150 to 400 keV. Beam energies in the region of the knee 154 produce the greatest luminescence intensity consistent with acceptable divacancy concentrations. Therefore, as in the manufacture of diode 10, irradiation energies between 290 and 310 keV produce devices with expected optimum luminescent output.

The luminescent output of an irradiated diode is also dependent on G-centre concentration. Below a certain concentration, internal efficiency is below that of band-to-band transitions. At a G-centre concentration below $10^{12}$ cm$^{-3}$, efficiency is unacceptably low irrespective of the divacancy content. Above this G-centre concentration, the efficiency is dependent on divacancy concentration. At a fixed irradiation energy, within the limits given above, the G-centre concentration is dependent on the carbon concentration and the irradiation dose. Moreover, the maximum dose is limited to that which does not severely impair diode rectifying characteristics and internal quantum efficiency. An excessive dose produces a significant concentration of shallow carrier traps, such as a vacancy/oxygen atom complex. At room temperature these traps are not important because carrier mobility prevents effective trapping. However, at 77 K., shallow traps become more effective and hence more significant.

In addition to impairment of rectifying properties, increased dosage requires increased processing time. This is commercially unattractive. It also causes heating, which tends to anneal out G-centres and reduce luminescent efficiency. These limits on the dose mean the carbon concentration must be greater than $10^{16}$ cm$^{-3}$. At this concentration, the maximum possible dose would produce the lower G-centre concentration limit of $10^{12}$ cm$^{-3}$. Preferably, however, the carbon concentration is arranged to be greater than $10^{16}$ cm$^{-3}$.

To produce an acceptable electroluminescent device, using irradiating beam energies in the range 150–400 keV, the range of practical doses varies depending on the beam energy chosen. For an irradiating energy of 150 keV, the dose may be between $10^{18}$ to $10^{19}$ electrons cm$^{-2}$, and at 400 keV, between $10^{15}$ to $10^{16}$ electrons cm$^{-2}$. At the preferred energy of about 300 keV, the dose range is $10^{16}$–$10^{18}$ electrons cm$^{-2}$.

Each G-centre is associated with two adjacent substitutional carbon atoms and an interstitial silicon atom. Accordingly, a high carbon concentration results in a high G-centre concentration upon irradiation. The diode 10 has a carbon concentration above the maximum equilibrium solubility limit of carbon in pure silicon. This carbon concentration is comparatively high, and enhances the internal quantum efficiency of the diode 10. The aforementioned fabrication steps achieve this concentration by pulling a silicon crystal vertically upwards from a carbon-rich melt in a vertical magnetic field. In addition, under these conditions, it is possible to increase the oxygen content of the melt and consequently reduce carbon evaporation. In addition, high interstitial oxygen content stabilises high levels of substitutional carbon. Further details are set out by K G Barraclough et al in Proc Fifth Int Symposium on Silicon, Mat Sci and Tech, "Silicon 1986", edited by Huff et al and published by the Electrochemical Society.

Another method for producing high carbon concentrations in single crystal silicon comprises low pressure vapour phase epitaxial growth or molecular beam epitaxy at temperatures below 850° C. At low temperatures, the solid solution may be maintained above the maximum equilibrium solubility limit due to carbon diffusion and precipitation being kinetically hindered.

A third method for increasing the carbon content is by ion implantation, followed by pulsed laser annealing in the melt regime or by rapid thermal annealing of the solid phase.

G-centres may be amphoteric in nature, which means they may act as both hole and electron traps. Consequently, G-centres may be located on the p-side or n-side of a p-n junction. In the diode 10 the G-centres are located on the $n^-$ side of the $p^+/n^-$ junction 43. Additionally, the $n^-$ side is doped with phosphorus, which unlike boron does not compete with carbon for silicon interstitials. Boron is the dopant for the $p^+$ side, therefore the efficiency of the device 10 would be affected by locating the G-centres on that side.

The invention is not restricted to devices utilising p-n junctions as rectifying means. PIN, Schottky and tunnelling diode structures may also be used to inject carriers into the region containing G-centres.

Electroluminescence may also be achieved in silicon junction diodes containing defect centres other than G-centres. Such luminescent centres include known carbon-related defects which produce the H and P zero phenon lines at wavelengths of 1.34 $\mu$m and 1.61 $\mu$m respectively. Other examples of carbon-related, irradiation-generated defect centres are presented by G Davies et al in J Phys C Solid State Phys L499-503 (1984).

Furthermore, even higher levels of carbon may be stabilised in substitutional sites by co-doping with isoelectronic group IV elements, namely germanium, tin or lead. As indicated previously, the resulting increase in the concentration of luminescent centres will further increase the diode efficiency.

The invention may be incorporated in integrated circuits. In this case it is necessary to produce localised optical centres within a conventional material structure. Thus rather than use a high carbon wafer as previously described, the technique of carbon ion implantation in combination with transient annealing, or selective area epitaxy, and near-threshold selective electron irradiation would be used for creation of localised G-centres.

Figure 16:
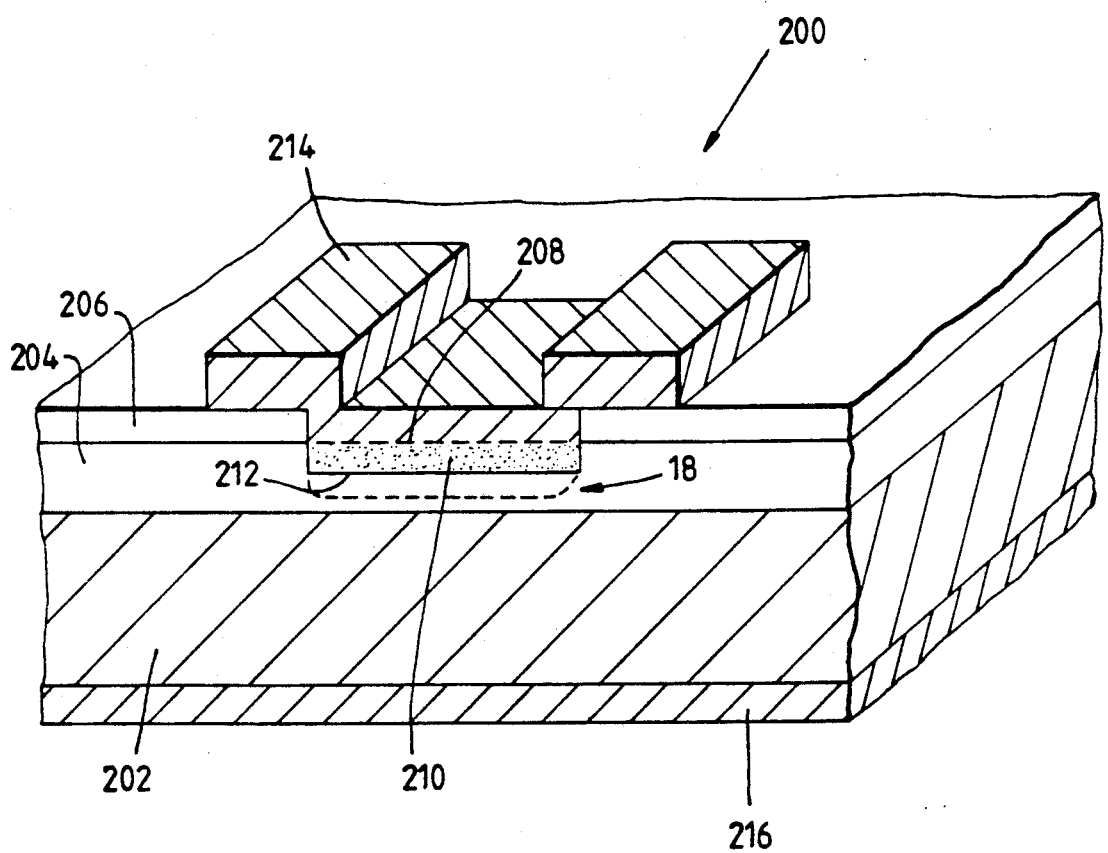
FIG. 16 shows a light emitting device integrated into a CMOS microcircuit substrate
Figure 17:
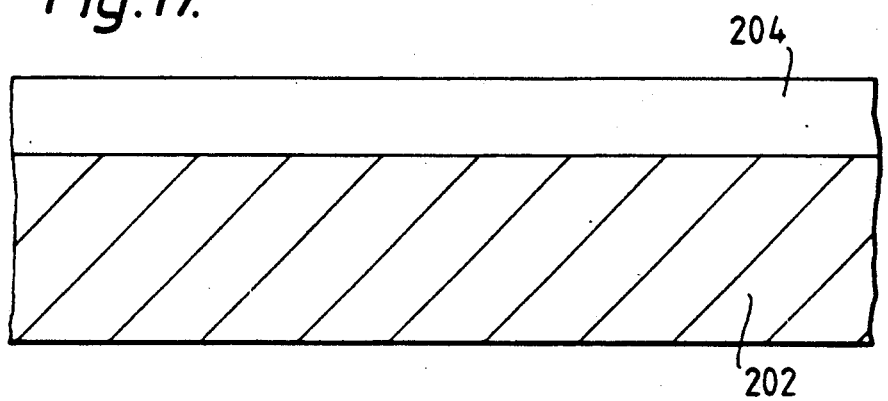
FIGS. 17 to 23 illustrate steps in the manufacture of the FIG. 16 diode.
Figure 18:
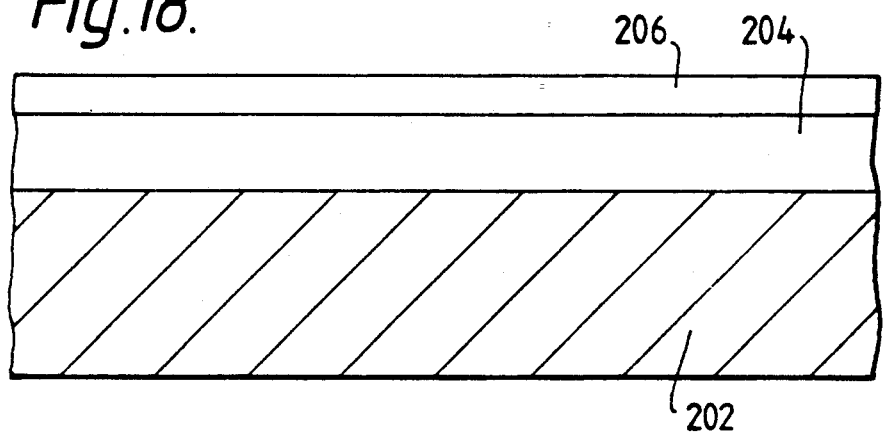
Figure 19:
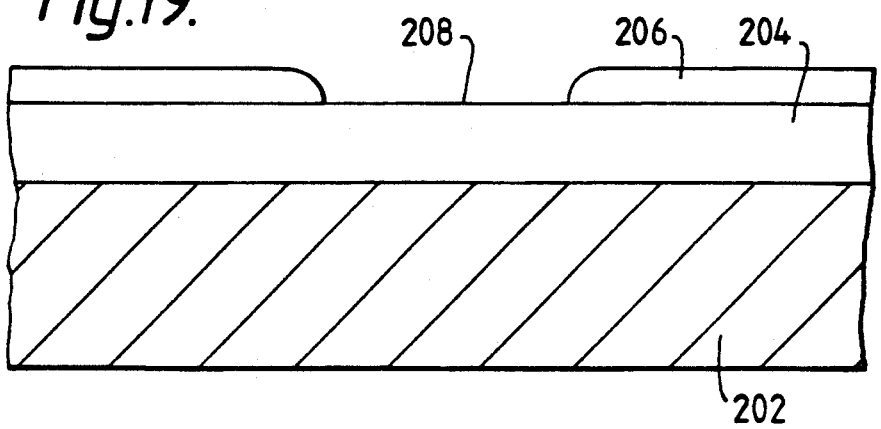
Figure 20:
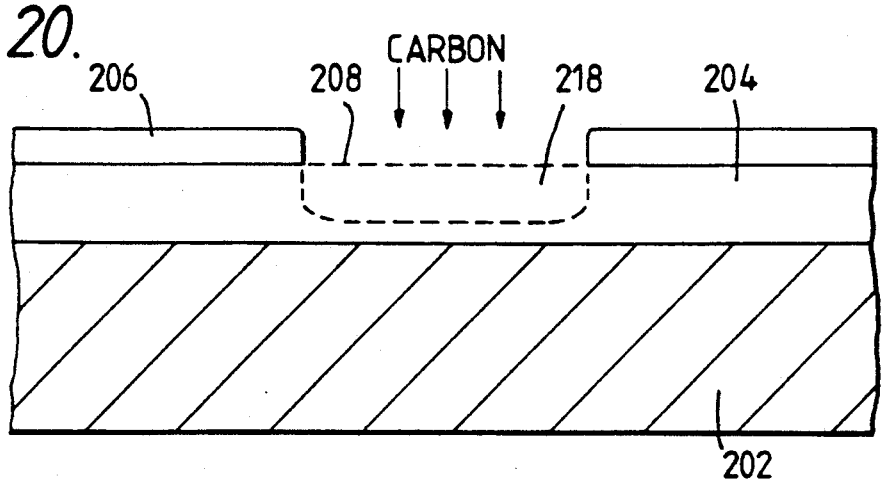
Figure 21:
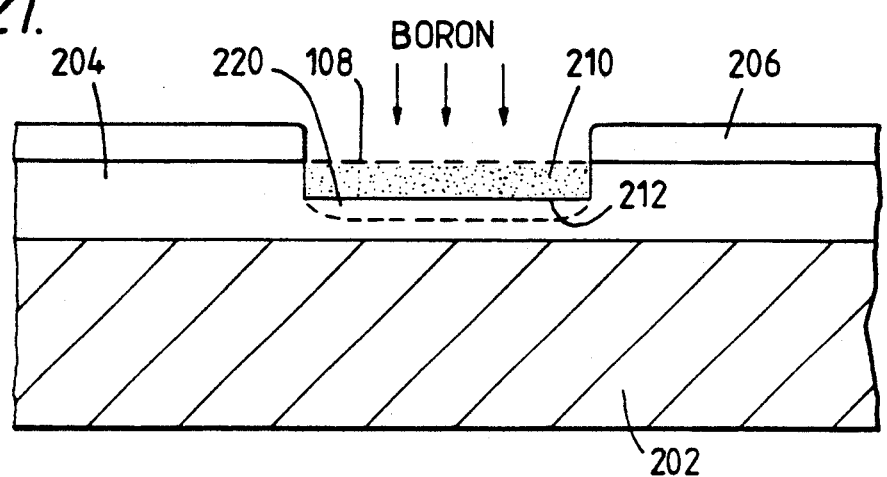
Figure 22:
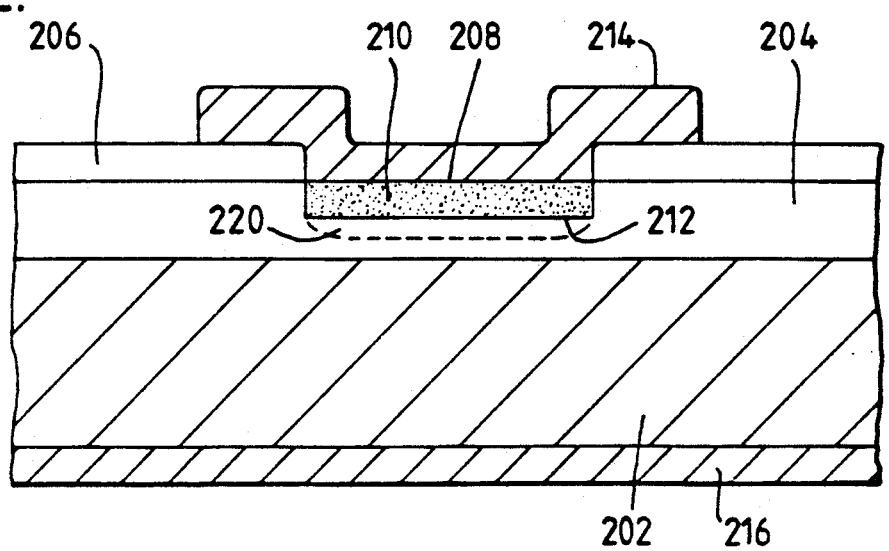

Referring now to FIG. 16, there is schematically shown a light emitting diode device 200 having a form compatible with CMOS microcircuit construction. The device 200 consists of a heavily doped n-type or $n^+$ silicon semiconductor substrate 202 surmounted by a lightly doped n-type or silicon semiconductor epitaxial layer 204. A silicon oxide layer 206 covers the layer 204, except for a window 208 above a carbon doped region 218 and a $p^+$ semiconductor contact 210. Below the region 210 is a $p^+/n^-$ junction 212. Aluminium layers 214 and 216 are deposited above the oxide layer 206 and contact 208, and below the substrate 202 respectively for electrical connection purposes.

Referring now to FIGS. 17 to 23, there are schematically shown the stages of manufacture of the device 200. The $n^+$-type semiconductor substrate 202 is formed from a Czochralski grown dislocation-free silicon crystal and is antimony-doped with a concentration of $5 \times 10^{18}$ atoms cm$^{-3}$. The $n^-$ semiconductor layer 204 on the substrate 202 is grown by known epitaxial methods and phosphorus-doped with a concentration of $5 \times 10^{15}$ atoms cm$^{-3}$. Layer 204 may be 5 to 10 $\mu$m in thickness. All doping is performed using known techniques. The substrate 202 together with the layer 204 forms a common starting element for p-well bulk CMOS microcircuits.

The silicon oxide layer 206 is produced by the standard process step of thermal oxidation, and is typically 0.5 to 1 $\mu$m thick. The window 208 in oxide layer 206 is produced by the known technique of wet etching and is typically a square with 10 $\mu$m sides.

A carbon-doped region 218 of the layer 204 is produced below the window 208 by ion implantation using ion energies of 180 keV and a dose of about $10^{14}$ atoms cm$^{-2}$. The implanted carbon has a range of 0.38 $\mu$m.

The $p^+$-type semiconductor contact 210 is produced by boron doping the carbon-doped region 218 by ion implantation with low ion energies, i.e. 30 keV, and a dose of typically $5 \times 10^{15}$ atoms cm$^{-2}$. This produces a boron-doped region with an implant range of 0.1 $\mu$m. The $p^+/n^-$ junction 212 is formed at a depth of 0.3 $\mu$m below the window 208. Boron and carbon doping create a carbon-rich layer 220 within the depletion layer of device 200, the layer being on the $n^-$ side of the $p^+/n^-$ junction 212. The depletion layer has a width of approximately 0.5 $\mu$m and extends below the carbon-rich layer 218.

Activation of the boron implant and production of a supersaturated layer of carbon is achieved by rapid thermal annealing.

The contacts 214 and 216 are formed on the upper $p^+$ surface, and on the base of the $n^+$ substrate by Al or Al—Si—Cu evaporation and low temperature alloying, for example, 450° C. for 10 minutes.

As previously described, G-centres are created in the carbon-rich layer 220 by electron irradiation at electron energies in the range 150 keV to 400 keV with a dose in the range $10^{16}$ to $10^{19}$ e$^-$ cm$^{-2}$. It is essential to avoid silicon lattice damage and trapping of charge in the oxide of neighbouring parts of the microcircuit. Such damage may be avoided by focussing the electron beam on the window 208. Moreover the beam may be scanned within the area of the window.

Figure 23:
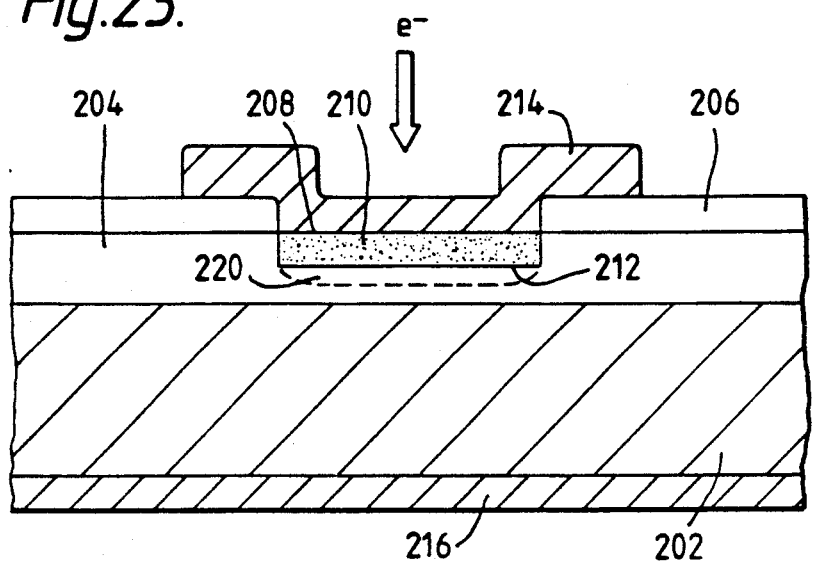
Figure 24:
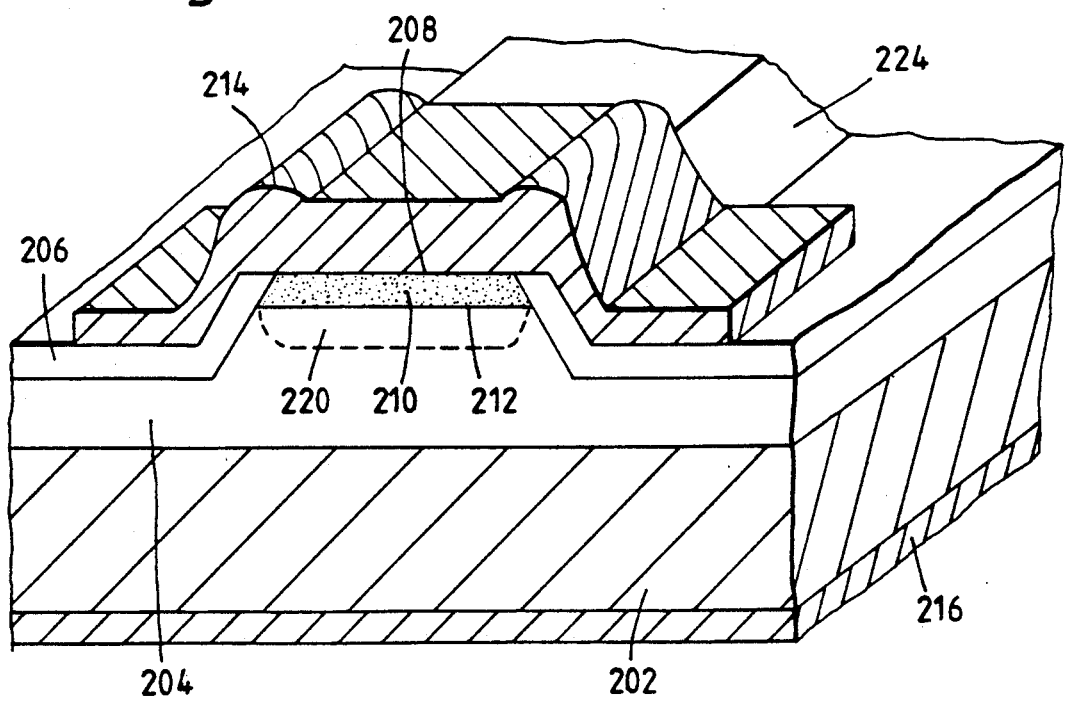
FIG. 24 shows a light emitting device integrated into a CMOS microcircuit substrate with an integrated waveguide section for transmission of light.

Referring now to FIG. 24, in which parts equivalent to those of FIG. 23 are like-referenced, there is shown an alternative embodiment of the device 200 arranged to have optical waveguide properties. In this embodiment, the device 200 has a central region of increased thickness to accommodate a waveguide 224 within which active diode components are located. The waveguide 224 has somewhat oblique wall construction as an artefact of production by wet anisotropic etching. Photon output from the device 200 is guided to another part (not shown) of the layer 204 by the waveguide 224. This provides for optical communication between different microcircuit regions. The waveguide 224 incorporates the $n^-$-type layer 204 in the region 220, and photons generated by device 200 are waveguide confined.

We claim:

1. An electroluminescent device comprising:
   a luminescent region of crystalline silicon; and
   rectifying means for injecting minority carriers into the luminescent region, wherein said luminescent region comprises:
   (i) at least $10^{16}$ carbon atoms $cm^{-3}$ in solid solution arranged to trap silicon interstitials and provide an irradiation generated luminescent defect centre concentration of at least $10^{14}$ $cm^{-3}$,
   (ii) a divacancy concentration less than $10^{-15}$ $cm^{-3}$, and
   (iii) a dopant which is at least substantially electrically inactive and has vacancy trapping properties and a concentration of at least $10^{16}$ $cm^{-3}$.

2. A device according to claim 1 wherein said carbon atom, defect center and dopant concentrations are at least $10^{18}$ $cm^{-3}$, $10^{16}$ $cm^{-3}$ and $10^{18}$ $cm^{-3}$, respectively.

3. A device according to claim 1 wherein said defect center are G-centres.

4. A device according to claim 1, wherein said electrically inactive dopant is oxygen.

5. A device according to claim 1 wherein said electrically inactive dopant is one of germanium, tin and lead.

6. A device according to claim 1 wherein said rectifying means is a pn junction between the luminescent region and a second silicon device region of opposite conductivity type.

7. A device according to claim 6 wherein said luminescent region is n-type.

8. A method of manufacture of an electroluminescent device comprising the steps of:
   (i) forming a diode including a carbon-doped silicon luminescent region containing vacancy trapping means, and
   (ii) irradiating the luminescent region with an electron beam having energy sufficient to produce vacancies but insufficient for direct creation of divacancies.

9. A method according to claim 8 wherein said diode luminescent region is formed with at least $10^{18}$ carbon atoms in solid solution in crystalline silicon and wherein the vacancy trapping means is a substantially electrically inactive dopant having vacancy trapping properties and a concentration of at least $10^{18}$ $cm^{-3}$.

10. A method according to claim 9 wherein said electrically inactive dopant in said forming step is one of germanium, lead and tin.

11. A method according to claim 8 wherein said diode in said forming step comprises a second region of opposite conductivity type to and contiguous with the luminescent region.

12. A method according to claim 11 wherein said luminescent region in said forming step in n-type.

13. A method according to claim 12 wherein said electron beam energy in said irradiating step is in the range 150 keV to 400 keV and the irradiation dose is in the range $10^{15}$ to $10^{19}$ electrons $cm^{-2}$, wherein higher beam energy corresponds to lower dosage.

14. A method according to claim 13 wherein said electron beam energy in said irradiation step is in the range 290 keV to 310 keV and the irradiation dose is in the range $10^{16}$ to $10^{18}$ electrons $cm^{-2}$.

15. An electroluminescent device made by the method steps of:
   (i) forming a diode including a carbon-doped silicon luminescent region containing vacancy trapping means, and
   (ii) irradiating the luminescent region with an electron beam having energy sufficient to produce vacancies but insufficient for direct creation of divacancies.

* * * * *